United States Patent
Markunas et al.

(10) Patent No.: US 7,112,536 B2
(45) Date of Patent: Sep. 26, 2006

(54) PLASMA PROCESSING SYSTEM AND METHOD

(75) Inventors: Robert J. Markunas, Chapel Hill, NC (US); Gaius G. Fountain, Youngsville, NC (US); Robert C. Hendry, Hillsborough, NC (US)

(73) Assignee: Research Triangle Institute, Research Triangle Park, NC (US)

( * ) Notice: Subject to any disclaimer, the term of this patent is extended or adjusted under 35 U.S.C. 154(b) by 84 days.

(21) Appl. No.: 10/349,081

(22) Filed: Jan. 23, 2003

(65) Prior Publication Data

US 2003/0106641 A1 Jun. 12, 2003

Related U.S. Application Data

(62) Division of application No. 09/466,128, filed on Dec. 21, 1999, now Pat. No. 6,558,504.

(60) Provisional application No. 60/113,354, filed on Dec. 21, 1998.

(51) Int. Cl.
*H01L 21/302* (2006.01)

(52) U.S. Cl. ............... 438/728; 438/706; 438/710; 438/732; 156/345.46

(58) Field of Classification Search .......... 438/706, 438/710, 728, 729, 732; 216/68, 69; 156/345.46, 156/345.48
See application file for complete search history.

(56) References Cited

U.S. PATENT DOCUMENTS

| | | | |
|---|---|---|---|
| 5,811,022 A | 9/1998 | Savas et al. | |
| 5,824,605 A * | 10/1998 | Chen et al. | 438/729 |
| 5,874,014 A | 2/1999 | Robson et al. | |
| 5,908,565 A | 6/1999 | Morita et al. | |
| 6,149,760 A | 11/2000 | Hama | |
| 6,155,199 A * | 12/2000 | Chen et al. | 118/723 I |
| 6,297,595 B1 * | 10/2001 | Stimson et al. | 315/111.51 |
| 6,310,577 B1 | 10/2001 | Ra | |
| 6,322,661 B1 | 11/2001 | Bailey, III et al. | |
| 6,352,049 B1 | 3/2002 | Yin et al. | |
| 6,390,019 B1 | 5/2002 | Grimbergen et al. | |

* cited by examiner

*Primary Examiner*—Lan Vinh
(74) *Attorney, Agent, or Firm*—Oblon, Spivak, McClelland, Maier & Neustadt, P.C.

(57) ABSTRACT

A plasma processing system and method wherein a power source produces a magnetic field and an electric field, and a window disposed between the power source and an interior of a plasma chamber couples the magnetic field into the plasma chamber thereby to couple power inductively into the chamber and based thereon produce a plasma in the plasma chamber. The window can be shaped and dimensioned to control an amount of power capacitively coupled to the plasma chamber by means of the electric field so that the amount of capacitively coupled power is selected in a range from zero to a predetermined amount. Also, a tuned antenna strap having r.f. power applied thereto to produce a standing wave therein can be arranged adjacent the window to couple magnetic field from a current maximum formed in the strap to the interior of the chamber. A desired amount of magnetic field and/or electric field coupling can be produced by arrangement of the chamber window adjacent that portion of the antenna strap exhibiting the desired current/ voltage relationship. The system may be formed in a line source configuration, or in a cylindrical source configuration. The window may have slots and/or apertures, the size and shape of which may be variable.

9 Claims, 6 Drawing Sheets

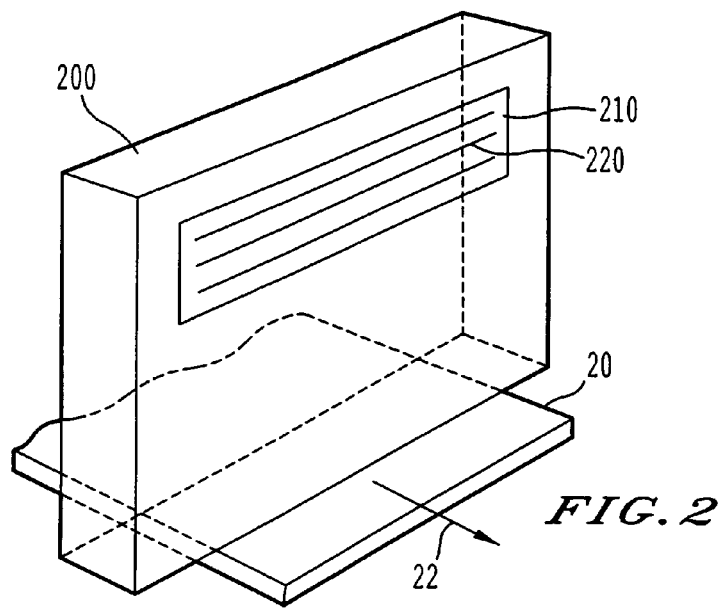
FIG. 2
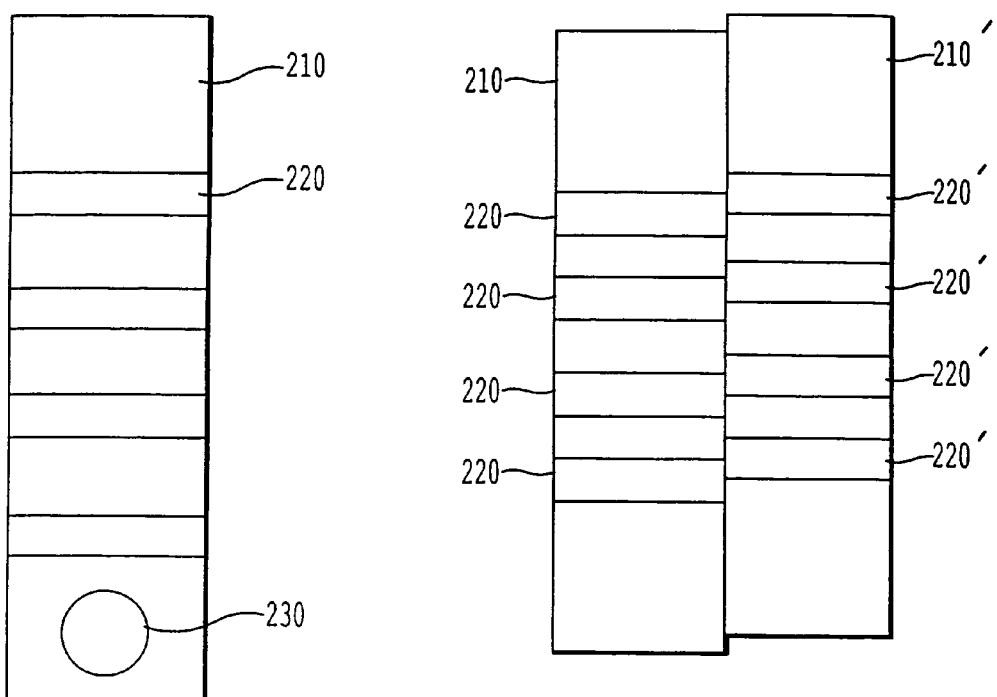
FIG. 3A
FIG. 3B

PLASMA PROCESSING SYSTEM AND METHOD

CROSS REFERENCE TO RELATED APPLICATIONS

This application is a divisional of Ser. No. 09/466,128 filed Dec. 21, 1999 now U.S. Pat. No. 6,558,504 which claims benefit of priority under 35 USC § 119(e) to U.S. Provisional Application No. 60/113,354, filed Dec. 21, 1998.

BACKGROUND OF THE INVENTION

1. Field of the Invention

The present invention relates to a plasma processing system and method, and more particularly to a plasma processing system and method with inductive coupling.

2. Discussion of the Background

Conventional plasma reactors used in semiconductor manufacturing have round parallel plate electrodes. A sample typically rests on a lower electrode and a plasma is formed above the sample to create reactive species to carry out deposition or etching operations. The power is coupled to the plasma capacitively.

For large area depositions, such as polycrystalline silicon deposition to form flat panel displays, it is difficult to use the round parallel plate reactors since larger area deposition requires larger electrodes which complicates the deposition process. Also, the machine becomes larger, greatly increasing its cost and the cost to use such a machine, since clean room floor space is very expensive.

A line plasma source has been developed, as described in application Ser. No. 08/383,495, the disclosure of which is herein incorporated by reference. A diagram of the source is shown in FIG. 1. A semiconductor wafer 20 with a top surface 20S is shown being transported in a transport direction (depicted by arrow 22) relative to plasma source 24 in a plasma reactor 25. Plasma source 24 includes a plasma chamber 30. Plasma chamber 30 includes walls for defining an essentially elongated narrow rectangular volume. Plasma chamber 30 includes chamber sidewalls 34SL and 34SR, and chamber top wall 34T. A face of plasma chamber 30 opposite chamber top wall 34T is open, forming a chamber outlet aperture. A plasma 44 is generated in the upper portion of the chamber and active species exit the chamber through a long, narrow "line" outlet where they react with a reactive gas or gas mixture on the sample surface. The sample is translated past the plasma line source and the film grows on the sample in a linear fashion. The power is applied to the reactor shown in FIG. 1 with an electric field applicator 50 encased in shield 52. The electric field applicator is positioned outside of the plasma chamber to couple an electric field through the plasma. Quartz windows 48 are disposed in the plasma chamber in the vicinity of the electric field applicator.

The above system has a problem when running at high power levels. The reactor has both current and capacitive components and at high power, and the capacitive component creates difficult problems for plasma reactors. At low frequency operation, the ions may develop significant kinetic energy from the applied a.c. field which may damage the electrodes or chamber walls and which may lead to contamination of the product. Typically the reactors are operated at higher frequencies so the ions cannot react to the a.c. field thereby to avoid collisions. However, operating the reactor at higher frequencies does not solve the problem. While the ions cannot follow the field reversal, a voltage develops between the plasma and the surroundings, termed the self-bias voltage. This DC voltage can accelerate ions into the walls resulting in chamber erosion, contamination of the work product and damage to the work product.

The line source is advantageous in forming large area polycrystalline silicon films. The problems described above occurs when forming such films since the depositions times are not short, increasing the possibility that some of the ions accelerated due to the self-bias will collide with the walls and/or with the product.

SUMMARY OF THE INVENTION

It is an object of the present invention is to provide a high power plasma reactor.

It is a further object of the present invention to provide a high power plasma reactor while eliminating, minimizing and/or controlling the self-bias voltage.

It is a further object of the present invention to provide a plasma reactor in a line configuration to treat large area substrates.

Another object of the present invention is to couple power inductively to a plasma while controlling capacitive power coupling to a selected amount.

These and other objects of the invention are achieved by a plasma processing system and method wherein a power source produces a magnetic field and an electric field, and a window disposed between the power source and an interior of a plasma chamber couples the magnetic field into the plasma chamber thereby to couple power inductively into the chamber and based thereon produce a plasma in the plasma chamber. The window can be shaped and dimensioned to control an amount of power capacitively coupled to the plasma chamber, and thereby enhance production of a particular plasma species within the chamber, by means of the electric field so that the amount of capacitively coupled power is selected in a range from zero to a predetermined amount. The amount of capacitive coupling is, however, quite small and does not significantly contribute to plasma formation. Also, a tuned antenna strap having r.f. power applied thereto to produce a standing wave therein can be arranged adjacent the window to couple magnetic field from a current maximum formed in the strap to the interior of the chamber. A desired amount of magnetic field and/or electric field coupling can be produced by arrangement of the chamber window adjacent that portion of the antenna strap exhibiting the desired current and voltage relationship. The window may have slots and/or apertures, the size and shape of which may be variable.

The window may be integrally formed in a wall of the plasma chamber. It is also advantageous to form a cooling conduit in the window to cool the window during plasma processing.

The system according to the invention is advantageously applied to a line source configuration. The invention may also be applied to a cylindrical plasma chamber and a cylindrical power source. Such a configuration is compact and easily handles plasma processing pressures. The cylindrical source may be also used in a scanning configuration where the source is scanned in order to produce a sample compared to scanning a sample across a fixed source. In the cylindrical configuration a coil may be embedded in a dielectric or quartz member and an electric field window serving as a window may be disposed about the coil.

According to the present invention there is also provided a method of plasma processing, including generating a magnetic field and an electric field; coupling the magnetic field into a plasma chamber to couple power inductively into the chamber and thereby produce a plasma in the plasma chamber; and controlling an amount of power capacitively coupled to the plasma chamber by means of the electric field so that the amount of capacitively coupled power is selected in a range from zero to a predetermined amount. In a preferred embodiment the method includes coupling power substantially only inductively by blocking substantially all of the electric field entering the chamber based on the shape and dimensioning of a window in the wall of the chamber. In this embodiment, the window maybe shaped and dimensioned to pass only a selected amount of the electric field to allow a desired amount of capacitive coupling to the plasma to tune the plasma chamber for production of desired plasma species. The amount of power introduced by capacitive coupling to the interior of the chamber is nevertheless quite small, and does not appreciably contribute to plasma formation. In another embodiment, the method includes generating substantially only a magnetic field to be coupled into the chamber in the vicinity of a chamber window using a tuned strap antenna in which a standing wave is produced and having a current maximum arranged adjacent the window. Alternatively, where it is desired to couple some electric field into the chamber, the chamber window can be arranged adjacent a portion of the strap in which current and voltage have a predetermined relationship to couple a desired amount of magnetic field and electric field into the chamber.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 2 is a schematic depiction of a plasma chamber according to the invention;

FIG. 3A is a sectional view, taken along the lines 3A—3A of FIG. 2, of a window member integrated into a chamber sidewall of the chamber shown in FIG. 2;

FIG. 3B is a sectional view similar to that of FIG. 3A, of an integrated window provided in the sidewall of a chamber, and including a sliding input control plate to derive a variable effective aperture size;

DESCRIPTION OF THE PREFERRED EMBODIMENTS

Figure 1:
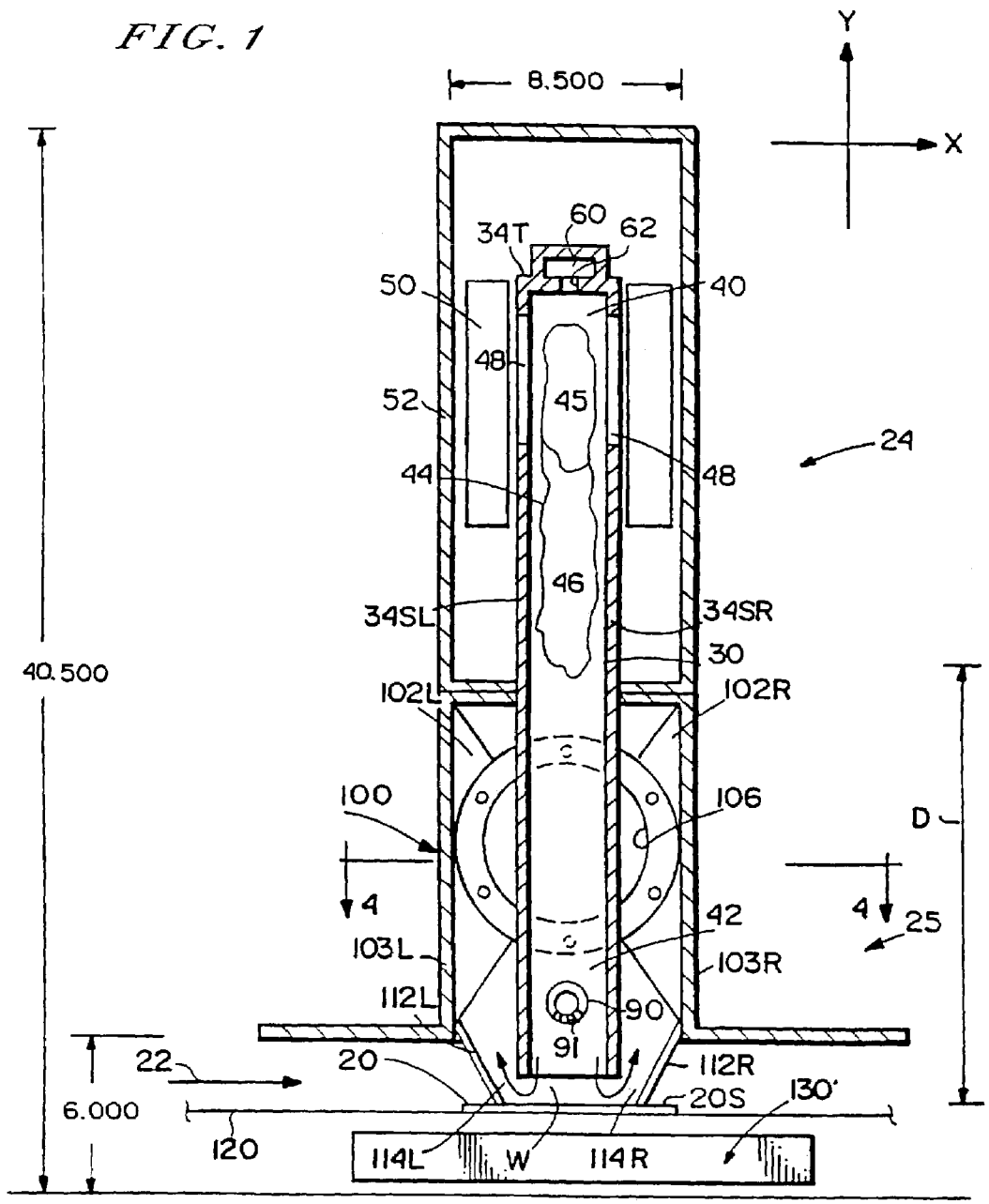
FIG. 1 is a cross sectional end view of a plasma reactor including a line plasma source.

Referring now to the drawings, wherein like reference numerals designate identical or corresponding parts throughout the several views, and more particularly to FIG. 2 thereof which shows a plasma chamber according to a first embodiment of the invention.

The plasma chamber includes chamber 200 configured in a line-source arrangement. Also shown in FIG. 2 are sample 20 and direction arrow 22 indicating the direction in which the sample 20 is transported across the lower opening of chamber 200. Chamber 200 has a window 210 with slots 220. Window 210 is a conductive material that can shield electric fields, preferably metal. Another window 210 may be disposed on the opposing face of chamber 200. The size and position of window 210 may be varied as well as the size, arrangement and configuration of the slots 220. For example, window 210 could be a screen material having apertures, preferably in the form of a square or circle.

A cross section of window 210 is shown in FIG. 3A. The dimensions of FIG. 3A are chosen to illustrate the invention and are not intended to show actual dimensions. FIG. 3A illustrates the slots 220 and also illustrates a port 230 which could be used as a cooling conduit. Water or another cooled liquid could flow through the conduit 230 to allow cooling of the plates. This is an advantage compared to the system shown in FIG. 1 where it is typically very difficult to cool the quartz windows.

As shown in FIG. 3B, which schematically shows in cross-section another integrally formed window, it is also possible to vary the effective aperture size presented to incident fields by providing a slidable input plate 210' having slots 220' offset with respect to the slots 220 of the window 210.

The walls of the chamber 200 are typically made of stainless steel which could be structurally ribbed. A typical thickness of the chamber wall is 0.5–1 cm. The windows 210 could have a dimension similar to the thickness of the chamber walls. However, a thickness of the window 210 may be varied in order to accommodate the cooling conduits or for other considerations. It is also possible to use a portion of the wall of the chamber as the window. In this case the slots are integrally formed in the wall as shown in FIG. 2

Dimensions of the slots 220 and the chamber wall thickness are application specific. Typically, however, the chamber wall thickness and slot width vary from ⅛ inch to 1 inch, and the slot separation varies from 1–8 inches.

Figure 4:
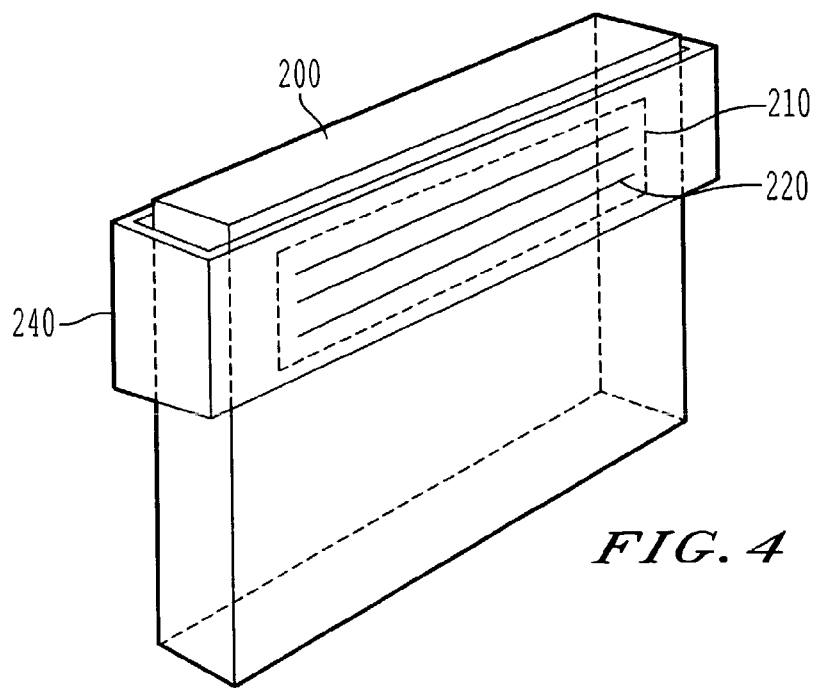
FIG. 4 is a schematic diagram of the plasma chamber of FIG. 2 and a power source.

FIG. 4 schematically illustrates a power supply 240, for example in the form of a coiled conductor, located proximate to the window 210 with slits 220 to produce a magnetic field which penetrates into the chamber through the slots 220. The number of coils and the power applied to the coils may be varied to produce the desired magnetic field strength. The magnetic field penetrates the window 210, but window 210 acts as a Faraday shield to an electric field. The window thus blocks capacitive coupling of the power supply to the plasma, while permitting inductive coupling.

Figure 5:
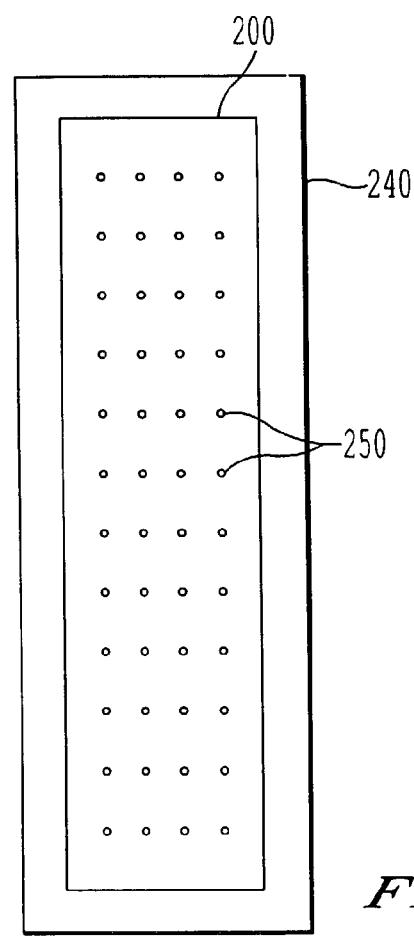
FIG. 5 is a top sectional view of the magnetic field lines in a plasma chamber.

As shown in FIG. 5, a top sectional view of FIG. 4, the coupling in the chamber produces a field direction (show as lines 250) which is tangential to the walls. Thus, ions excited by the plasma are not driven into the wall or into the sample. Moreover, there is no capacitive coupling and hence no self-bias voltage which may also drive ions into the chamber walls or the sample.

It may also be desirable to provide a controlled amount of capacitive coupling in the system. In certain instances, it may be advantageous to give a particular energy to the species to improve the deposition and/or etching characteristics of the plasma. One way to accomplish control the amount of capacitive coupling is by varying the size of the slots 220 (or other aperture), for example, as shown in FIG. 3B.

Figure 6:
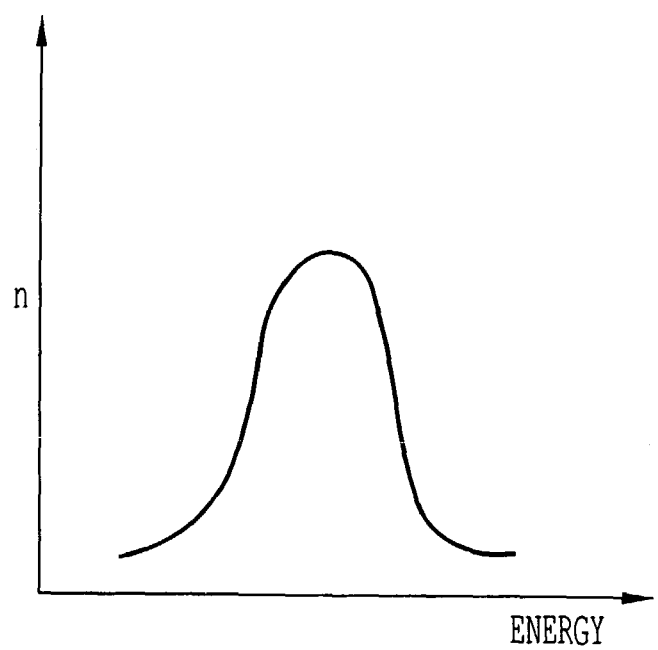
FIG. 6 is a graph illustrating a distribution of the number of a species of ion as a function of energy.

FIG. 6 shows a distribution of the number n of a species of an ion as a function of energy. The capacitive coupling contribution will determine the position of the distribution while the inductive coupling determines the value of n. The inductive and coupling contributions may be varied to give the desired distribution for a particular deposition or etching procedure. The control of the capacitive coupling essentially controls the self-bias voltage to a desired value.

Figure 7:
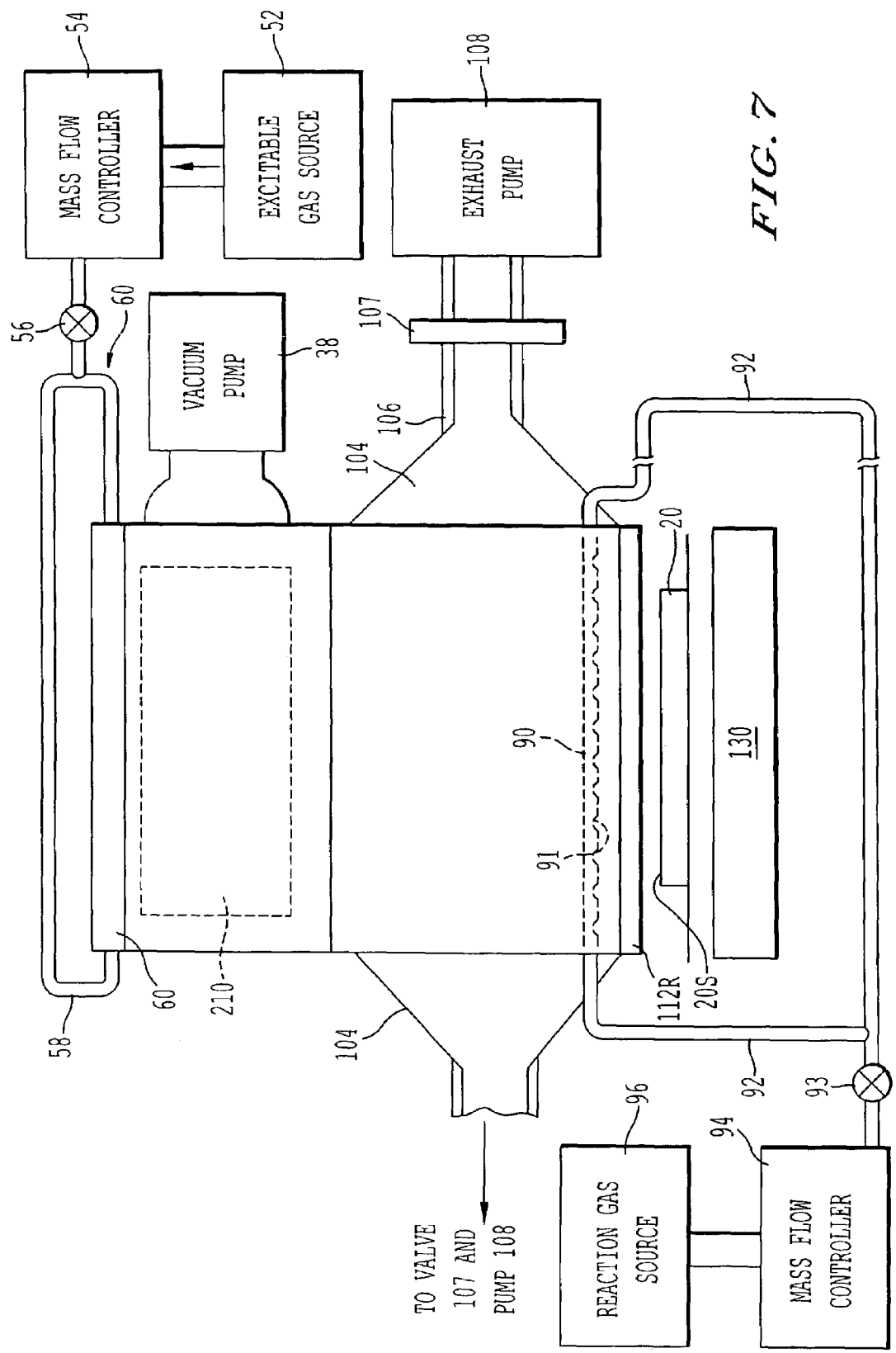
FIG. 7 is a diagram of a plasma processing system according to the invention.

The power source provides a magnetic field in the chamber which produces the plasma. The plasma source is preferentially the line source which allows for the advantages described in application Ser. No. 08/383,495. For example, the plasma source could include a reaction gas discharge manifold 90 having orifices 91 circumferentially located in the manifold. The plasma source may also include a gas delivery and removal system as shown in FIG. 1 which simplifies pumping requirements. A more complete system diagram is shown in FIG. 7 including gas sources 52 and 96, mass flow controllers 54 and 94, pump 108, valves 56, 93 and 107, and plumbing 58 and 92. FIG. 7 is merely an example to illustrate the invention and is not meant to limit the configuration of the invention. Other configurations are possible, as well as other configurations of the plasma chamber to produce reactive species for particular etching and/or deposition procedures.

Figure 8:
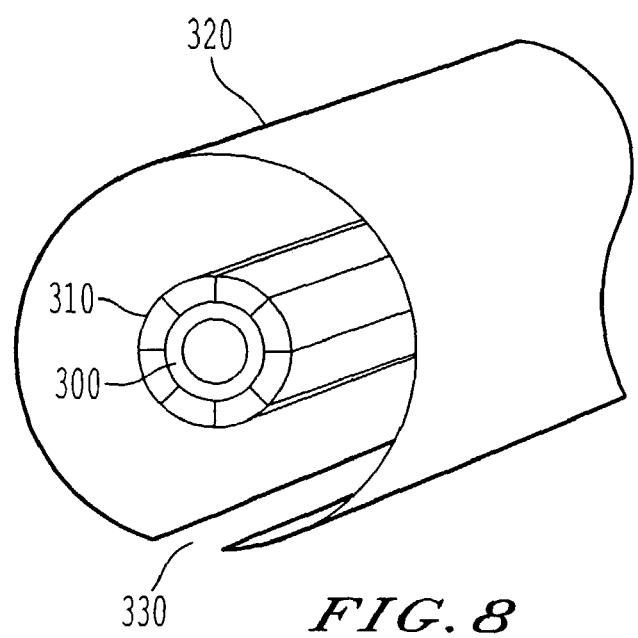
FIG. 8 is a diagram of a second embodiment according to the invention.

A second embodiment of the invention is shown in FIG. 8. A housing 320, made preferably of stainless steel, includes a cylindrical plasma source having a quartz cylinder 300 housing a coil (not shown) surrounded by a slotted metal cylinder 310. Other materials may be used instead of the quartz cylinder. The slotted metal cylinder could also have apertures formed of a screen material, as discussed in connection with the first embodiment. Slotted metal tube 310 acts as a Faraday shield to eliminate or control the capacitive coupling component. The magnetic field lines run parallel to the longitudinal direction of the cylinder. In the housing 320 a plasma is formed, in this example, at the lower portion near the exit aperture 330. The cylindrical shape is better able to handle the pressures associated with etching and deposition procedures. It is also more compact and lighter and can be moved closer to the exit portion of the chamber to increase plasma intensity.

Figure 9A:
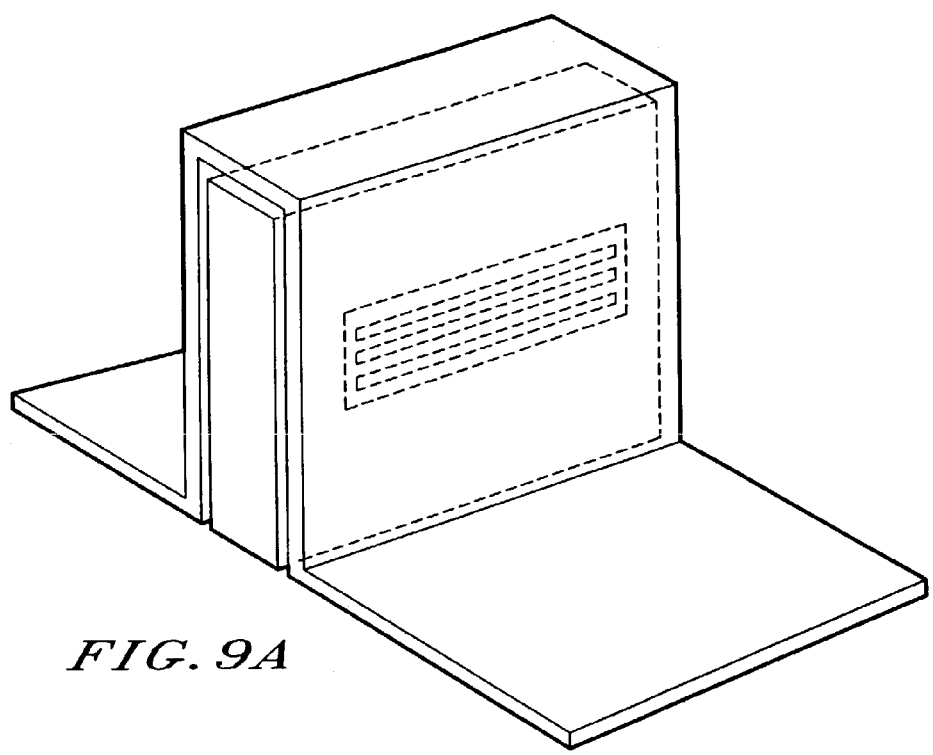
FIGS. 9A and 9B are schematic perspective and side views of an embodiment of the present invention including an antenna applicator to couple energy into the interior of a plasma chamber.
Figure 9B:
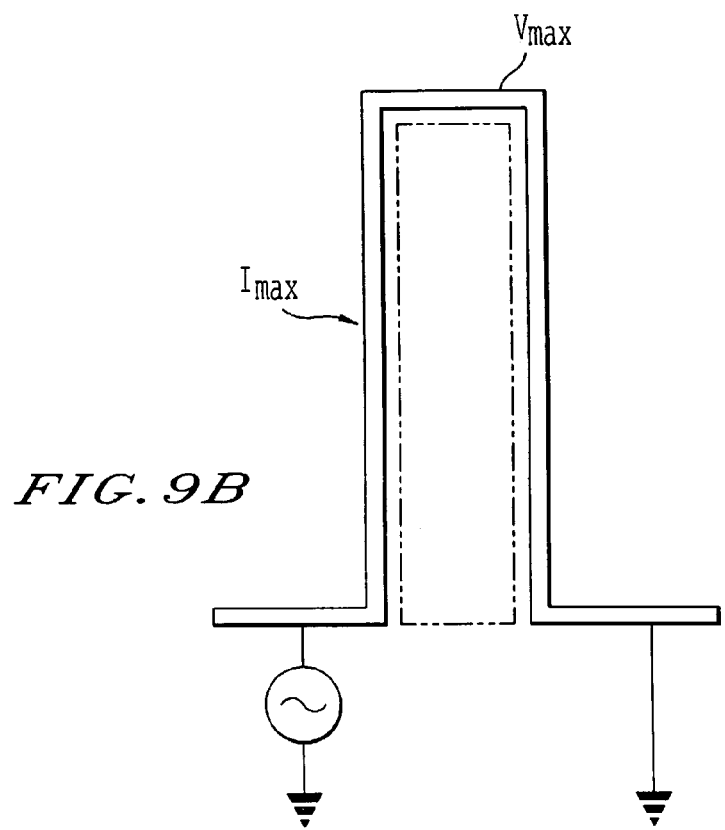

A further embodiment of the present invention is shown in FIGS. 9A and 9B. In this embodiment, the power source includes a strap antenna 400 positioned around the chamber 200. The strap antenna has a.c power applied thereto and radiates electric and magnetic fields towards the chamber 200. Preferably, the strap antenna 400 is tuned, by appropriate dimensioning of the strap, to the frequency of the power supply for resonant operation in which a standing wave is produced, resulting in electric and magnetic fields that are out of phase with each other by 90°. If the strap antenna 400 is appropriately dimensioned to produce a standing wave in the antenna 400, it is possible to arrange the window 210 adjacent a current maximum to maximize coupling of a maximum magnetic field to the interior of the chamber. By appropriate selection of the frequency of the of the power source and the dimensions of the strap antenna, it is possible to have standing wave of a single wavelength produced, with a current maximums corresponding to magnetic field maximums located on the sides of the chamber adjacent opposite windows 210 and voltage maximums corresponding to electric field maximums located 90° away at the top of the chamber and at the end of the strap antenna, thereby to minimize capacitive coupling and maximize inductive coupling to the chamber. Alternatively, where a selected amount of capacitive (electric field) coupling to the interior of the chamber is desired, the window 210 can be arranged at some point intermediate to current and voltage maximums, i.e., magnetic and electric field maximums. Typical operation frequencies in this regime are ~10–~200 MHZ and typical operating powers are ~100–~10,000 watts. A wide range of applications exists, including substrate etching, cleaning, and layer depositions, as well as waste disposal or conversion of hazardous substances to a more benign form of compound.

The system and method according to the invention thus provides all the advantages of a line source while providing the further advantage of eliminating or controlling the self-bias voltage which can lead to deleterious effects in the plasma processing operations. The present invention can both keep the plasma remote from the sample to avoid damage or move the plasma more close to the sample to improve plasma intensity.

Obviously, numerous modifications and variations of the present invention are possible in light of the above teachings. It is therefore to be understood that within the scope of the appended claims, the invention may be practiced otherwise than as specifically described herein.

What is claimed and desired to be protected by Letters Patent of the United States is:

1. A method of plasma processing, comprising:
   generating a magnetic field and an electric field;
   coupling the magnetic field into a plasma chamber to couple power inductively into the chamber and thereby produce a plasma in the plasma chamber; and
   controlling an amount of electric field capacitively coupled to the plasma chamber so that an amount of capacitively coupled power is selected in a range from zero to a predetermined amount by a pair of adjacent multiply slotted windows.

2. A method as in claim 1, comprising:
   controlling the amount of electric field capacitively coupled to the plasma chamber in relation to a particular plasma species to be produced within the plasma chamber.

3. A method as in claim 1, wherein the step of controlling comprises:
   disposing the slotted windows between a power source generating the magnetic and electric fields and the plasma chamber so as to couple inductive power and said selected amount of capacitive power to the plasma chamber through said windows into said chamber.

4. A method as in claim 3, wherein at least one of said windows has at least one aperture and the step of controlling comprises:
   selecting at least one of a size and a shape of the windows to couple a predetermined amount of capacitively coupled power to the plasma chamber.

5. A method as in claim 4, wherein the step of controlling comprises:
   varying at least one of a size and a shape of said at least one aperture to tune an amount of capacitively coupled power introduced into the plasma chamber in relation to a particular plasma species to be produced within the plasma chamber.

6. A method of plasma processing, comprising:

generating a magnetic field and an electric field;

coupling the magnetic field into a plasma chamber through a window to couple power inductively into the chamber and thereby produce a plasma in the plasma chamber; and controlling an amount of electric field capacitively coupled to the plasma chamber so that an amount of capacitively coupled power is selected in a range from zero to a predetermined amount, wherein said generating step comprises applying r.f. power to a tuned antenna strap disposed partially around the plasma chamber to produce a standing wave characterized by current and voltage maximums and minimums in said antenna strap; and said coupling step comprises arranging a portion of said antenna strap having a current maximum and a voltage minimum adjacent said window.

7. A method as in claim 6, wherein said controlling step comprises:

dimensioning said window adjacent said antenna so as to exclude electric field from entering into said plasma chamber via said window.

8. A method of plasma processing, comprising:

generating a magnetic field and an electric field;

coupling the magnetic field into a plasma chamber through a window to couple power inductively into the chamber and thereby produce a plasma in the plasma chamber; and controlling an amount of electric field capacitively coupled to the plasma chamber so that an amount of capacitively coupled power is selected in a range from zero to a predetermined amount, wherein said generating step comprises applying r.f. power to a tuned antenna strap disposed partially around the plasma chamber to produce a standing wave characterized by current and voltage maximums and minimums in said antenna strap, and said coupling step comprises arranging a portion of said antenna strap not having a current maximum adjacent said window to couple the predetermined amount of magnetic field and electric field into said plasma chamber via said window.

9. A method as in any one of claims 1–5 and 6–8, comprising:

providing a plasma chamber having a longitudinally extending opening; and passing a workpiece to be treated by a plasma generated in the plasma chamber past the opening to expose the workpiece to the plasma.

* * * * *